United States Patent
Hata

(10) Patent No.: US 8,003,984 B1
(45) Date of Patent: Aug. 23, 2011

(54) RETICLE FOR WAFER TEST STRUCTURE AREAS

(75) Inventor: William Y. Hata, Saratoga, CA (US)

(73) Assignee: Altera Corporation, San Jose, CA (US)

( * ) Notice: Subject to any disclaimer, the term of this patent is extended or adjusted under 35 U.S.C. 154(b) by 56 days.

(21) Appl. No.: 11/951,304

(22) Filed: Dec. 5, 2007

Related U.S. Application Data

(62) Division of application No. 11/205,756, filed on Aug. 16, 2005, now Pat. No. 7,316,935, which is a division of application No. 10/653,007, filed on Aug. 28, 2003, now Pat. No. 6,967,111.

(51) Int. Cl.
*H01L 23/58* (2006.01)
*H01L 21/66* (2006.01)

(52) U.S. Cl. ............ 257/48; 257/724; 257/786; 438/18; 438/129

(58) Field of Classification Search .................. None
See application file for complete search history.

(56) References Cited

U.S. PATENT DOCUMENTS

| | | | |
|---|---|---|---|
| 5,594,273 A | 1/1997 | Dasse et al. | |
| 5,616,931 A | 4/1997 | Nakamura et al. | |
| 5,923,047 A * | 7/1999 | Chia et al. | 257/48 |
| 6,124,143 A | 9/2000 | Sugasawara | |
| 6,146,908 A | 11/2000 | Falque et al. | |
| 6,262,435 B1 | 7/2001 | Plat et al. | |
| 6,614,235 B2 | 9/2003 | Kraz | |
| 6,844,218 B2 | 1/2005 | Potts | |
| 6,844,631 B2 | 1/2005 | Yong et al. | |
| 6,967,111 B1 | 11/2005 | Hata | |
| 7,316,935 B1 | 1/2008 | Hata | |
| 2002/0149120 A1 | 10/2002 | Sugiyama | |

FOREIGN PATENT DOCUMENTS

JP 02211648 8/1990

* cited by examiner

*Primary Examiner* — Alonzo Chambliss
(74) *Attorney, Agent, or Firm* — Ropes & Gray LLP

(57) ABSTRACT

Techniques are provided for forming die on wafers with large area test structures between primary die. A reticle is used to pattern each die. The pattern on the reticle forms a primary die and test structures in scribelines that abut edges of the die. A reticle can be used to form additional test structures that are separated from the primary die. A gap is formed between the additional test structures and the primary die in each exposure. In subsequent exposures, test structures for adjacent die are formed in the gaps between the previously formed primary die and their additional test structures. These techniques are used to provide larger test structure area between each primary die. A blade can be used to block portions of the reticle that form the additional test structures. The reticle can then be used to pattern die with smaller test structures during high volume chip production.

19 Claims, 5 Drawing Sheets

RETICLE FOR WAFER TEST STRUCTURE AREAS

CROSS-REFERENCES TO RELATED APPLICATIONS

This divisional application claims priority to U.S. patent application Ser. No. 11/205,756, filed Aug. 16, 2005, and U.S. patent application Ser. No. 10/653,007 filed Aug. 28, 2003, now U.S. Pat. No. 6,967,111, which are both incorporated by reference.

BACKGROUND

The present invention provides techniques for forming test structures in die on semiconductor wafers, and more specifically, to techniques for interleaving test structures of adjacent die that can be removed during high volume production using the same reticle.

In semiconductor processing, die are formed on semiconductor wafers using a reticle. A reticle is a transparent substrate, such as quartz, that is placed in the near focal plane of a projection system. Radiation, such as ultra violet light, is passed through the reticle and is projected onto a wafer to transfer the image upon that wafer. A patterned opaque coating is formed on the reticle, to define the image to be projected. The image consists of one or more die and various test and measurement structures between and around the die.

The area of the wafer that is exposed to radiation through an opening in the opaque coating of the reticle is referred to as the field area. One or more die can be patterned in a single field area. Multiple field areas can be formed next to each other by moving the reticle across the wafer.

An additional masking layer referred to as a blade, or blades, also masks the formation of the die. Because the opaque coating often contains spurious pinholes and defects, the blade is used to prevent imperfections in the opaque coating from forming spurious patterns on the wafer. However, alignment of the blade to the edge of the die is typically poor, because of mechanical tolerances, and because the blade is out of the focal plane.

Each die includes a primary die area that is patterned according to an integrated circuit design. Each die also includes test structures. Test structures are typically formed on a wafer in thin vertical and horizontal scribelines situated between adjacent primary die. The test structures include some or all of the processing layers used to form the integrated circuit.

The test structures can be used for many purposes. For example, the test structures can be used to measure the accuracy of the pattern transfer process, by providing a predefined structure with a physical dimension that can be measured. As another example, several layers can be combined to produce a simple semiconductor device or circuit, which can be electrically measured. The test structures are formed in narrow sacrificial regions that separate the die from each other. After the tests are performed, the test structures are cut out of the wafer and discarded.

With each new generation of semiconductor processing technology, the maximum field area exposed by a reticle increases. By increasing the field area of a reticle, less exposures are needed to pattern an entire wafer, saving time and cost. Therefore, the largest possible field area is typically used for each exposure, and each field is filled with as many die as possible.

Some integrated circuits require a large die area. In some cases, only one die is formed within a single reticle field area. As the reticle field area increases, the die area increases by the square of the diameter of the field size. However, in processes that place only one die in each reticle field area, the length of each scribeline only increases linearly as the reticle field area increases. Thus, for single-die field areas, the scribeline test structures become an increasingly smaller percentage of the total field area.

Some types of integrated circuits require complex processing technologies with many process layers. These types of circuits often need to have a larger test structure area relative to the size of the die in order to be able to perform all of the tests needed to verify numerous aspects of a complex processing technology. In addition, during the development of a new Silicon process technology, and verification of a new integrated circuit product, it is also advantageous to perform additional tests. These tests are used to monitor and refine the process. They are also used to better understand the interaction of the process with the integrated circuit design. If integrated circuits with complex processing technologies and many layers are formed in a single-die field area, the scribeline test structure area is often too small to accommodate all of the tests that need to be performed.

One solution is to create larger test structures relative to the primary die in each reticle field area. The area of the test structures can be increased by increasing the width of the vertical and horizontal scribelines. This means that a larger fraction of the area of a wafer is used to produce test structures, and a smaller fraction of the wafer is used to produce usable product. Specifically, the die is created so that enough test structure area exists in each die to perform the required tests. However, the cost of producing the product is increased.

Once the tests have been performed and proper operation of the test chip is verified, there is no longer a need for large scribelines between the die. It is more desirable to have narrower scribelines between the die for high volume production, so that more die can be formed on each wafer, and less sacrificial area is consumed by the test structures.

Another solution would be to produce a dedicated test chip. This die would include only test structures without a primary die. Producing the test chip may also require designing a dedicated reticle set. There is no usable or salable product. The cost of generating a dedicated test chip is expensive and the cost increases dramatically with each new generation of semiconductor processing technology. After the test chip experiments are completed, the data obtained by measuring the test chips are no longer required.

Therefore, it would be desirable to provide techniques for forming die on semiconductor wafers that create larger sacrificial test structures between the die to allow testing of complex processing technologies with many layers. It would also be desirable to provide techniques that allow the size of the test structures to be reduced during high volume die production without having to redesign the process steps or redesign the processing equipment.

SUMMARY

The present invention provides systems and methods for forming die on wafers that have large area test structures between the primary die. A reticle is used to pattern each die. The reticle is used to form a primary die and test structures in scribelines that abut edges of the primary die.

A reticle of the present invention can be used to form additional test structures that are separated from the rest of the die. A gap is formed between the additional test structures and the primary die in each exposure. In subsequent exposures, additional test structures for adjacent die are formed in the gaps between previously formed primary die and their test structures. These techniques are used to provide larger test structure area between each primary die. Larger test structures are needed by integrated circuits that use complex processing technologies with many layers.

According to the present invention, a reticle can be used to form test chips with large area test structures between the die. The same reticle can then be used to form smaller area test structures to achieve high density production of primary die. A blade is used to block portions of the reticle that form the additional test structures. The reticle can then be used to pattern die with smaller test structures. These primary die are placed closer together for high density and high volume production. Less wafer area is sacrificed for test structures, and more die are produced in each wafer.

Other objects, features, and advantages of the present invention will become apparent upon consideration of the following detailed description and the accompanying drawings, in which like reference designations represent like features throughout the figures.

DESCRIPTION OF EXEMPLARY EMBODIMENTS

Figure 1:
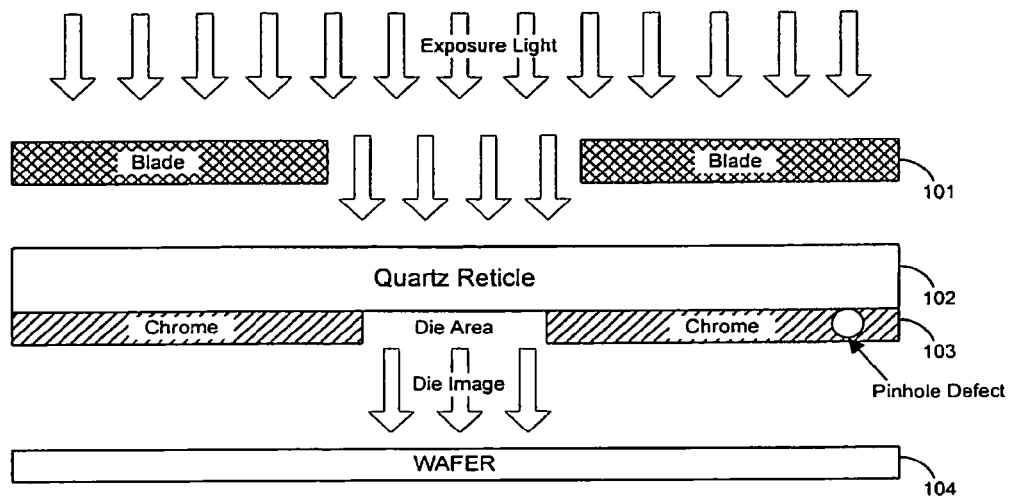
FIG. 1 illustrates a simplified diagram of semiconductor processing equipment according to the present invention.

FIG. 1 illustrates a simplified diagram of semiconductor processing equipment that relates to the present invention. The equipment shown in FIG. 1 includes a blade 101, a quartz reticle 102 with chrome plating 103, and a wafer 104. As shown in FIG. 1, wafer 104 is exposed to radiation that forms a die. Quartz reticle 102 is transparent. The radiation passes through an opening in blade 101 and through reticle 102.

Chrome plating 103 on the bottom surface of reticle 102 masks wafer 104 from the radiation. The die image forms on wafer 104 beneath the opening in chrome plating 103 as shown in FIG. 1. Chrome plating 103 often contains point defects or pinholes as shown in FIG. 1. Blade 101 blocks radiation from passing through pinholes and defects in chrome 103 to prevent spurious images on wafer 104.

Figure 2A:
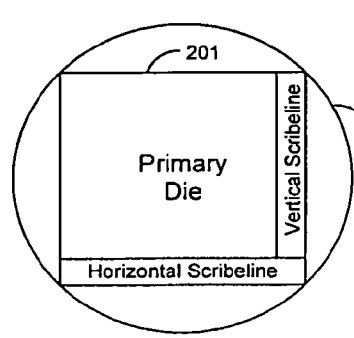
FIG. 2A illustrates a single die reticle field area.

The radiation imaging process shown in FIG. 1 forms a die on wafer 104 in a reticle field area as shown, for example, in FIG. 2A. One exposure forms a die 201 in reticle field area 202. Reticle field area 202 is masked by the opening in chrome plating 103.

Figure 2D:
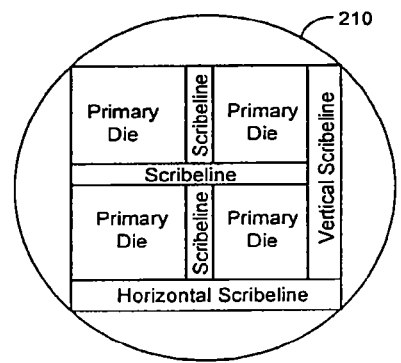
FIG. 2D illustrates a multiple die reticle field area.

Most reticle field areas are oval, and most die are rectangular. However, to simplify the calculations, circular reticle fields and square die are shown in FIGS. 2A and 2D.

Die 201 includes a primary die, a vertical scribeline, and a horizontal scribeline as shown in FIG. 2A. The vertical and horizontal scribelines are sacrificial test structures. Test structures contain some or all of the processing layers used to form the integrated circuit. The test structures can be used to test various features of an integrated circuit. For example, test structures can be used to the test the thickness, or the reflectivity of one or more of the process layers.

Figure 2B:
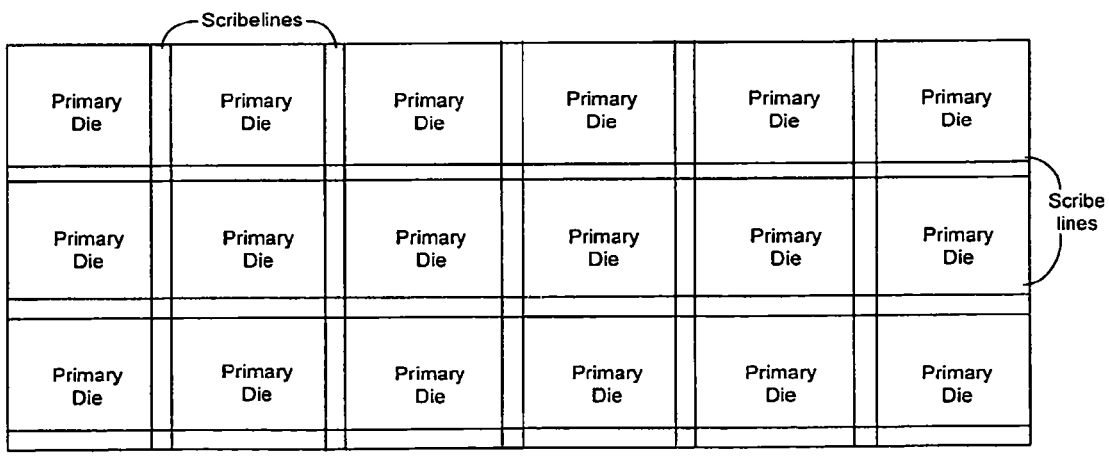
FIGS. 2B-2C illustrate multiple primary die formed on a wafer.

Multiple die such as the one shown in FIG. 2A are typically formed next to each other on a wafer. FIG. 2B illustrates how multiple die can be formed next to each other in rows on a wafer. Additional die are formed by moving reticle 102 and blade 101 across wafer 104. Each new die is formed next to a previously formed die. Each die contains a primary die as well as vertical and horizontal scribelines. The scribelines separate the primary die from each other.

Figure 2C:
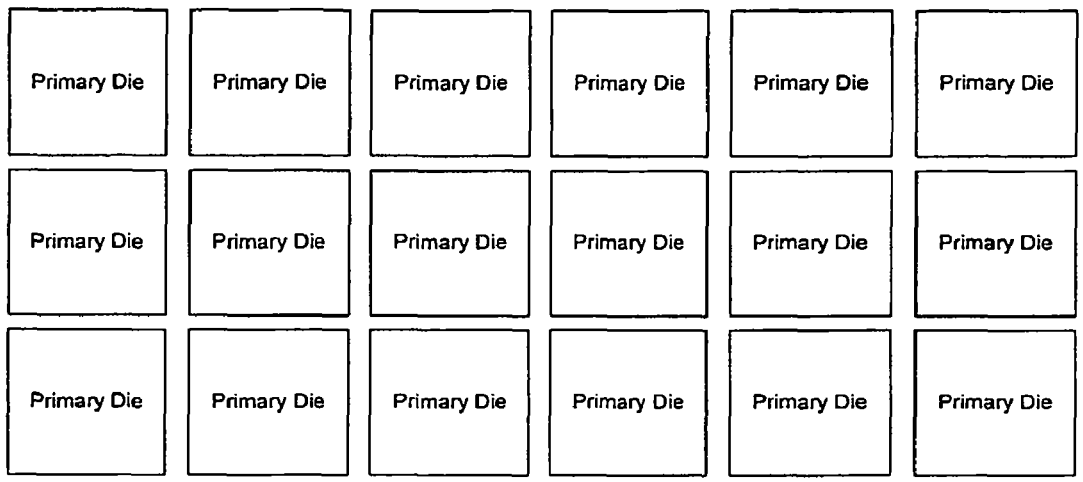

After the die have been formed on the wafer, tests are performed on the scribeline test structures. Then, the vertical and horizontal scribelines are cut out of the wafer, leaving only the primary die as shown in FIG. 2C.

Multiple primary die can be formed within each reticle field area. For example, in FIG. 2D, four primary die are patterned in reticle field area 210. Thus, FIG. 2D illustrates a multiple-die field area. Any number of smaller die can fit into a single field area. Vertical and horizontal scribeline test structures separate each of the four primary die in FIG. 2D. These scribelines are also cut out after the tests have been performed.

The maximum field area of a reticle is increasing with each process generation. As the reticle field area increases, more test structure area is typically needed in each die. This is because the area of the die increases by the square of the reticle field diameter, while the scribeline only increases linearly for a single die reticle. Thus, the test area becomes an increasingly smaller percentage of the reticle field relative to the total die area, as the reticle area is increased.

Each step and repeat exposure of a die image takes time. Reducing the number of steps and exposures, reduces the time and the cost associated with processing a wafer. Therefore, the largest reticle field area is used in each exposure, and each reticle field area is filled with an many die as possible. For all of these reasons, larger test structure areas are required on wafers to perform all of the necessary tests. The present invention provides techniques for creating the larger test structure areas.

FIG. 2A illustrates the largest diameter (d) die that can fit in a circular reticle field. FIG. 2A illustrates a single-die field area. In a single-die field area, only one primary die is formed in the reticle field area in each iteration of the processing steps. The smallest diameter of a die that is just slightly too large to fit two die into a field area is referred to as the smallest single die field area.

The difference between the largest and the smallest scribelines of a single die reticle field is about 0.38d. At 1.0 micron process technology, the reticle field diameter is about 1 centimeter (cm), and the difference between the largest single die scribeline and the smallest single die scribeline is about 0.38 cm. At 0.13 micron process technology, the reticle field diameter is about 6 cm, and the scribeline delta is about 2.25 cm.

Thus, there can be substantial differences between the thickness of scribelines in die of different sizes. Often many test structures cannot fit into the die that have smaller scribelines. For these additional reasons, there is a need for larger area test structures.

As semiconductor processing technology has advanced, the complexity of the processes and the number of layers has increased. As a result, an increased number of test line structures are needed to test the increasingly complex processes.

Most die are small enough to fit into one reticle field. In multiple die reticle fields (such as shown in FIG. 2D), there is more space for additional test structures. In complex process technologies with many layers, this additional space is filled with test structures. However, the test structures developed for multiple die reticle fields often cannot fit on the shorter scribelines for single die reticle fields. Thus, multiple width (larger area) test structures are needed.

Figure 3A:
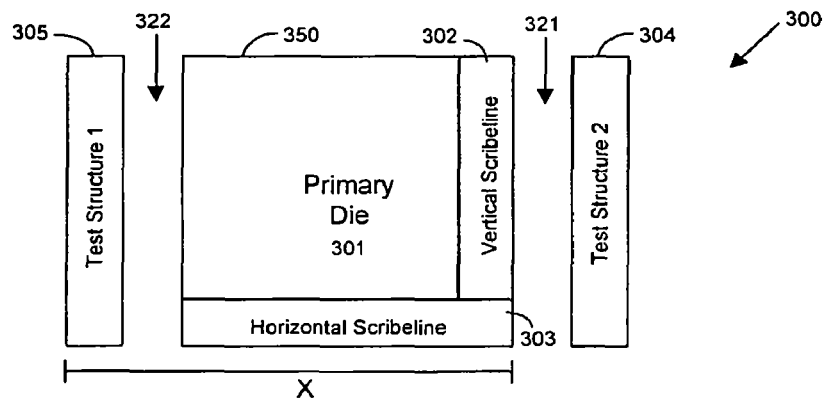
FIGS. 3A-3C illustrate die formed with additional test structures that are separated from the primary die by gaps in the horizontal direction according to the principles of the present invention.

FIG. 3A illustrates a first embodiment of the present invention. Die 300 in FIG. 3A can be formed on a wafer using a reticle with a chrome plating as shown in FIG. 1. Other techniques can also be used to pattern die 300. A reticle is discussed merely as an example of how die 300 can be patterned and is not intended to limit the scope of the present invention.

Die 300 includes die area 350 and additional test structures 304 and 305 according to the principles of the present invention. Additional test structure 304 and 305 are additional sacrificial scribelines that are used to perform additional tests on the layers of the integrated circuit.

Figure 3B:
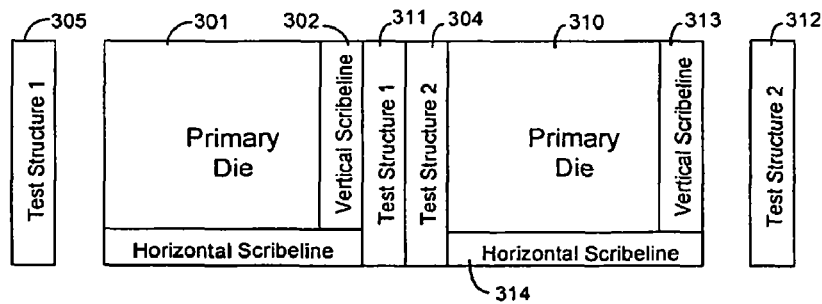

Die area 350 includes primary die 301, vertical scribeline 302, and horizontal scribeline 303. The gaps 321 and 322 between test structures 304-305 and die area 350, respectively, are formed so that additional test structures for adjacent die can fit in gaps 321-322 as shown in FIG. 3B. Chrome plating 103 can be designed with additional openings to form test structures 304-305.

According to the techniques of the present invention, the additional test structures and the die area that includes the primary die are separated by gaps as shown in FIG. 3A. The gaps 321-322 between test structures 304-305 and die area 350 are not patterned during the formation of die 300. Instead, additional test structures for adjacent die are formed in these gaps.

For example, as shown in FIG. 3B, primary die 310 is formed with additional test structures 311 and 312 as well as standard scribelines 313-314. Test structures 311-312 are separated from primary die 310 by gaps. Test structure 311 fills the gap 321 between vertical scribeline 302 and test structure 304. Test structure 304 fills the gap between test structure 311 and primary die 310 as shown in FIG. 3B.

The same reticle configuration can be used to form each of the die on the wafer. Each adjacent die is formed by moving the reticle across the wafer horizontally by a distance X shown in FIG. 3A. Because the same reticle configuration is used to form each die, all of the additional test structures formed to the left of each primary die are the same size (e.g., structures 305 and 311). Also, all of the additional test formed to the right of each primary die are the same size (e.g., structures 304 and 312).

Ideally, the additional test structures of the present invention fit perfectly in the gaps formed by the additional test structures of adjacent die. Therefore, additional test structure 304 is ideally separated from vertical scribeline 302 by the width of test structure 305, and test structure 305 is ideally separated from primary die 301 by the width of test structure 304.

Figure 3C:
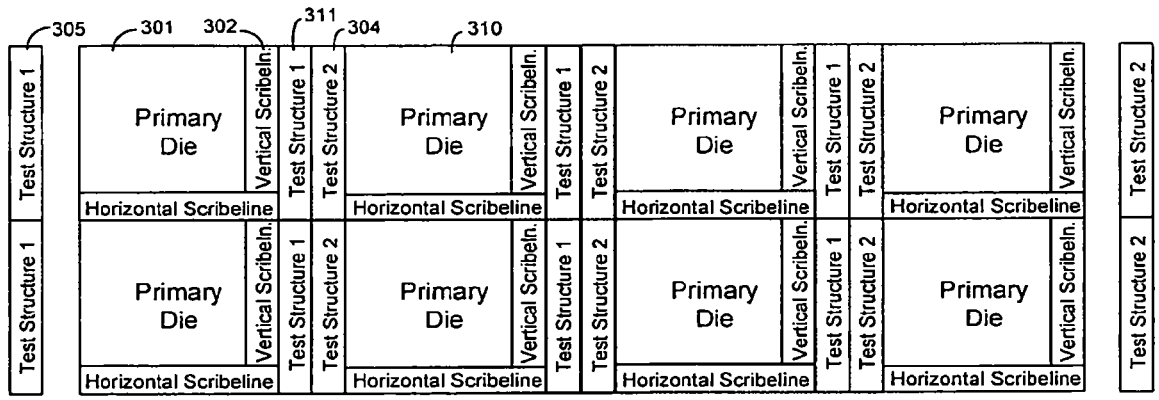

Die formed with additional test structures according to the principles of the present invention can also be formed above and below each other as shown, for example, in FIG. 3C. Two additional test structures are formed to the right and the left of each primary die. Thus, three test structures separate each of the primary die in the horizontal direction. For example, test structures 302, 311, and 304 separate primary die 301 and 310. In the example of FIG. 3C, only one test structure (the horizontal scribeline) separates each primary die in the vertical direction.

FIG. 3C illustrates two rows of die. However, any number of rows of die that can fit on the surface of wafer can be formed. Also, any number of die can be formed in each row depending on the size of each die and the available area on the wafer.

The present invention provides additional test structure surface area that is useful for performing additional tests on the processing layers. Often the scribelines shown in FIG. 2A are too narrow to perform all the tests needed in complex processing technologies with many layers. As discussed above, these types of circuits often need to have a substantial test structure area relative to the size of the die in order to be able to perform all of the required tests. The present invention increases the test structure surface area, relative to the surface area of each primary die, for performing additional tests that are required for many types of integrated circuits.

After the tests have been performed on the scribelines and the additional test structures of the present invention, the scribelines and the additional test structures are cut out of the wafer and discarded. Thus, the additional test structures of the present invention create additional sacrificial portions of the wafer that are discarded and not used to create an end product.

The additional test structures of the present invention are advantageous, because they provide additional test area. The additional test area can be useful to perform numerous tests on test chips. However, the additional test area may be undesirable for high volume and high density production of integrated circuits. Therefore, it may be desirable to eliminate the additional test structures during high volume production.

According to further embodiments of the present invention, the additional test structures shown in FIGS. 3A-3C can be eliminated easily without changing the reticle configuration used to form these additional test structures. Additional test structures 304-305 can be formed by creating extra openings in chrome plating 103 to the right and the left of primary die 301.

Figure 4:
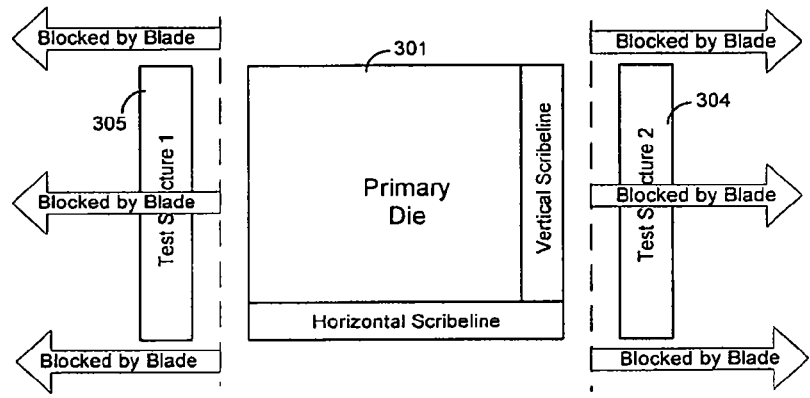
FIG. 4 illustrates how the additional test structures can be blocked by a blade without redesigning the reticle according to the principles of the present invention.

These extra openings in chrome 103 can be blocked by repositioning blade 101 to prevent the additional test structures from being patterned on the wafer. The opening in blade 101 can be narrowed as shown in FIG. 4 to block the openings in chrome 103 that are used to pattern additional test structures 304 and 305. When blade 101 is repositioned as shown in FIG. 4, additional test structures 304-305 are not formed on the wafer.

Figure 5:
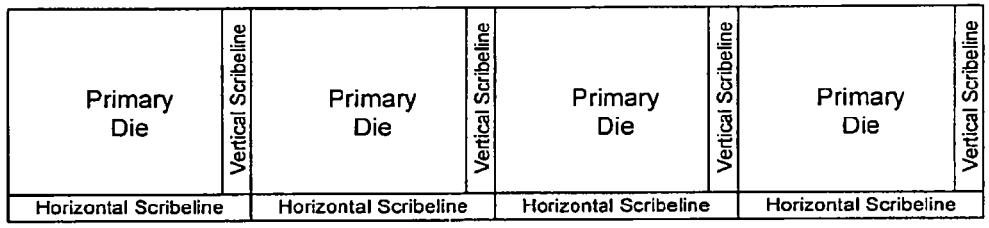
FIG. 5 illustrates die that are formed when the additional test structures are blocked by the blade according to the principles of the present invention.

Using this technique, the primary die patterned on the wafer are only separated by the vertical and horizontal scribelines as shown in FIG. 5. Because the primary die in this embodiment are only separated by one sacrificial test structure, more die can be patterned onto a single wafer. This technique greatly increases the number of integrated circuits that can be formed on a single wafer during high volume, high density production.

Thus, test chips can be initially created to test characteristics of integrated circuit designs. Additional test structures 304-305 can be formed on the test chips according to the techniques of the present invention. Numerous tests can be performed on the scribelines 302-303 and additional test structures 304-305 to ensure the proper operation of the test chips.

Subsequently, high volume production of the integrated circuit design is commenced. During high volume production, the openings in chrome plating 103 are blocked by blade 101 to prevent the formation of test structures 304-305. The resulting die are more closely packed together to produce more die per wafer.

Figure 6A:
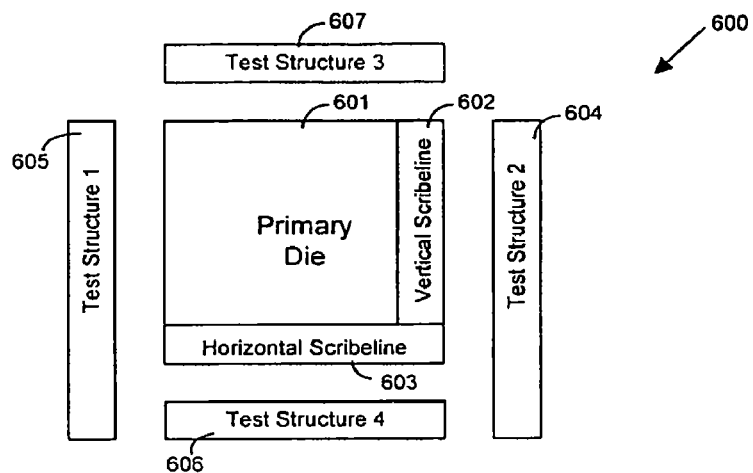
FIGS. 6A-6C illustrate die formed with additional test structures that are separated from the primary die by gaps in the vertical and the horizontal directions according to the principles of the present invention.
Figure 6B:
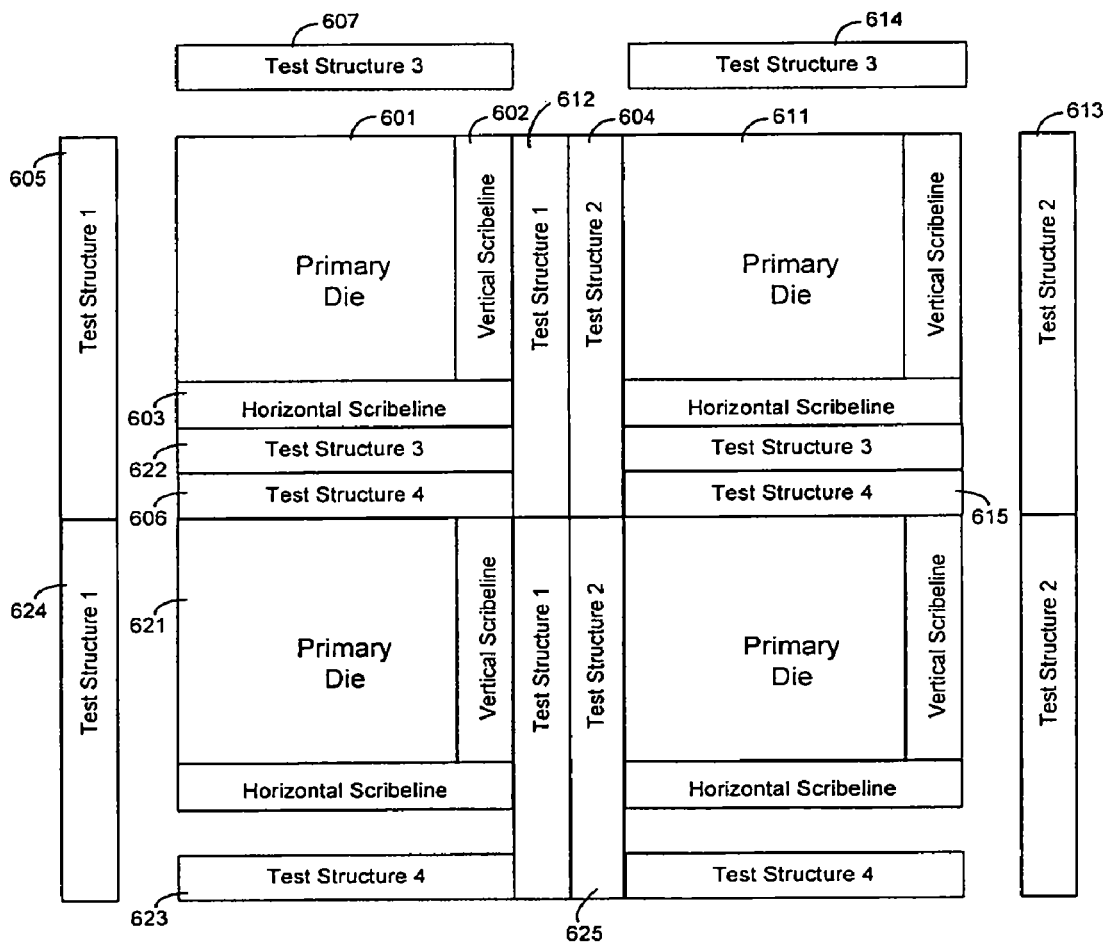

A further embodiment of the present invention is illustrated in FIGS. 6A and 6B. Referring to FIG. 6A, die 600 includes primary die 601, scribelines 602-603, and additional test structures 604-607. Die 600 can be formed by five openings in chrome plating 103. Each of the additional test structures 604-607 is separated from the die area that includes primary die 601 by a gap as shown in FIG. 6A.

In the embodiment of FIG. 6A, additional test structure 606 is formed below primary die 601, and additional test structure 607 is formed above primary die 601. Thus, all four sides of primary die 601 are surrounded by additional test structures 604-607.

Multiple die 600 can be patterned next to each other as shown in FIG. 6B. The additional test structures are formed in the gaps left by the patterning of previous die. For example, primary die 611 is formed next to primary die 601. Primary die 611 is formed with additional test structures 612-615. Additional test structure 612 is formed in between vertical scribeline 602 and additional test structure 604.

In addition, primary die 621, beneath die 601, is patterned with additional test structures 622-625. Additional test structure 622 is formed between horizontal scribeline 603 and additional test structure 606.

In the embodiment of FIGS. 6A-6B, three test structures are formed between each of the primary die in the vertical direction and in the horizontal direction. For example, three test structures 603, 622, and 606 are formed between primary die 601 and primary die 621. This embodiment of the present invention provides an even larger test structure area relative to the area of each corresponding primary die. By further increasing the test structure area, more tests can be performed on test chips to verify the characteristics of an integrated circuit design.

Figure 6C:
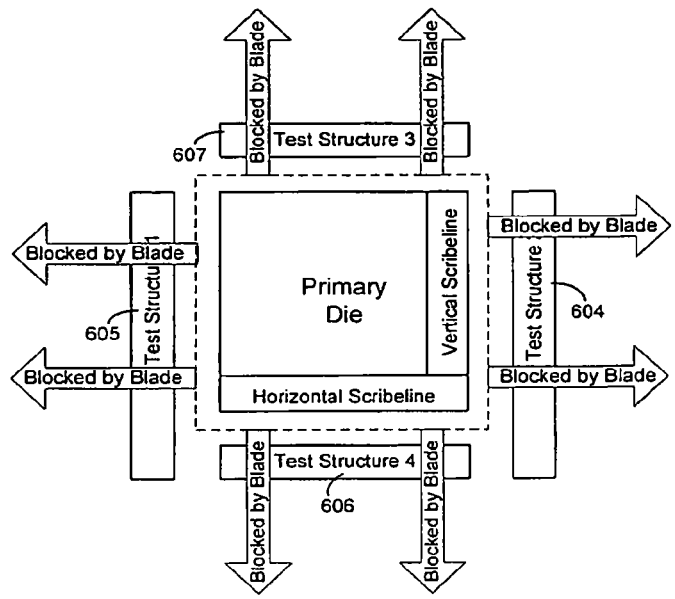

Once the tests have been completed, high volume production of the integrated circuit can commence. The opening in blade 101 is narrowed in all four directions as shown FIG. 6C to block the patterning of test structures 604-607 on the surface of the wafer. The primary die formed this way are only separated by the vertical and horizontal scribelines 602-603 as shown in FIG. 5. More integrated circuits can be created during high volume production by removing additional test structures 604-607.

Figure 7:
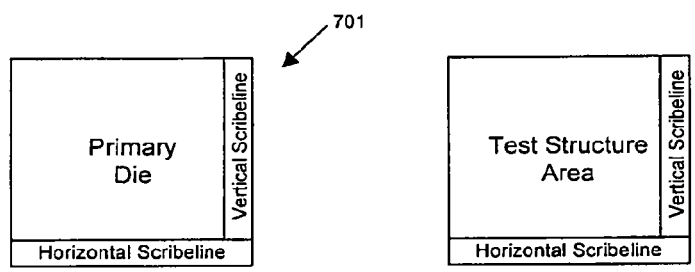
FIGS. 7-8 illustrate another embodiment of the present invention in which larger area test structures are formed to the right of the primary die.
Figure 8:
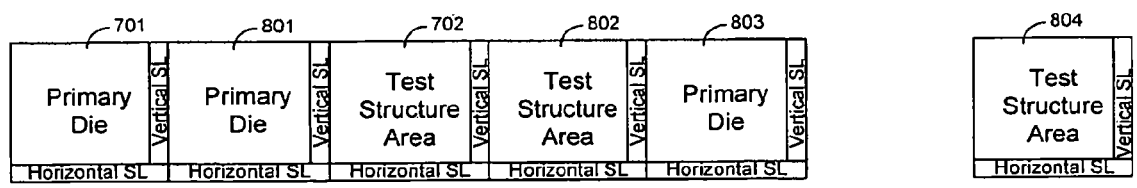

Another embodiment of the present invention is illustrated in FIGS. 7 and 8. Chrome plating 103 on reticle 102 is modified so that two structures 701 and 702 can be produced on the wafer during an exposure. Structure 701 includes the primary die that forms the final integrated circuit. Structure 701 also includes a vertical scribeline on its right edge and a horizontal scribeline on its bottom edge.

Structure 702 is an additional large area test structure that can be used to performed tests on the processing layers. Structure 702 is as large as structure 701 or a different size. Structure 702 is separated from structure 701 by a gap as shown in FIG. 7. The gap is not patterned during the formation of structures 701 and 702.

Structure 702 is shown in FIG. 7 with vertical and horizontal scribelines, which are also test structures. The scribelines in structure 702 are shown to illustrate that the patterns in the process layers used in structure 702 can be replicated and used to form structure 701. Alternatively, the patterned layers of structure 701 can be modified in test structure 702.

Referring to FIG. 8, a second set of structures 801 and 802 can be formed next to structures 701 and 702 by moving the reticle to the right by the width of structure 701. Structure 801 includes a primary die and two scribelines. Structure 802 is dedicated test structure with two scribelines. Structure 801 is formed between structure 701 and additional test structure 702.

A third set of test structures 803 and 804 can be formed by moving the reticle to the right by the width of structures 801, 702, and 802 as shown in FIG. 8. Structure 803 includes a primary die, and structure 804 is an additional test structure. In the resulting wafer, two additional test structures, such as structures 702 and 802, are formed in between every two primary die.

Test structures 702, 802, and 804 are cut out of the wafer after all of the tests have been performed. Additional test structures 702, 704, and 804 substantially increase the available test area and substantially reduce the percentage of the wafer surface area used to generate primary die for integrated circuits. In the embodiment of FIG. 8, less than half of the wafer surface area is used to form usable integrated circuits. During high volume production, the opening in blade 101 can be narrowed to prevent the formation of the additional test structures 702, 802, and 804.

FIG. 8 illustrates additional test structures formed only in the horizontal direction. However, additional test structures can also be formed in additional rows of die above and/or below each other in the vertical direction. The vertical additional test structures can have a large area such as test structure 702. The additional vertical and the horizontal test structures of the present invention can be formed in any suitable pattern.

Other sizes, shapes, and patterns of additional test structures can be formed on a wafer according to the principles of the present invention. An important feature of the present invention is that the additional test structures are separated from the primary die and the standard scribelines by gaps, as discussed above. The wafer area in the gaps is not patterned during the exposure that forms a particular primary die and its additional test structures. For example, test structure 702 is separated from structure 701 by a gap that is not patterned in the exposure that forms these two structures on the wafer.

During high volume production, it is typically desirable to form the die without the additional test structures as discussed above. Because gaps are formed between the additional test structures and the primary die, the blade can be easily adjusted to accurately prevent the formation of the additional test structures as shown, for example, in FIGS. 4 and 6C.

If the additional test structures abutted the edges of the primary die or the scribelines, it would be more difficult to completely block the formation of the additional test structures. Placing the additional test structures right next to the primary die leaves no room for error. If the blade were slightly offset during high volume production, a portion of the additional test structures would form on the wafer. Such errors could render the resulting die unusable.

The present invention provides techniques for creating additional test structures that can be accurately eliminated during high volume production without changing or redesigning the reticle or the process steps. This is important, because the cost of developing a dedicated reticle set for producing test chips is increasing dramatically with each new generation of product.

Although the present invention is discussed primarily in the context of single die reticle fields, it should be understood that the techniques of the present invention also apply to processes that use multiple die formed in each reticle field. For example, the die shown in FIG. 6B can be formed in a single reticle field area.

While the present invention has been described herein with reference to particular embodiments thereof, a latitude of modification, various changes, and substitutions are intended in the present invention. In some instances, features of the invention can be employed without a corresponding use of other features, without departing from the scope of the invention as set forth. Therefore, many modifications may be made to adapt a particular configuration or method disclosed, without departing from the essential scope and spirit of the present invention. It is intended that the invention not be limited to the particular embodiments disclosed, but that the invention will include all embodiments and equivalents falling within the scope of the claims.

What is claimed is:

1. A semiconductor wafer comprising:
   a first die formed on the wafer that comprises a first test structure and a first die area, wherein the first die area includes a first primary die and a first scribeline; and
   a second die formed on the wafer comprising a second test structure and a second die area that has a second primary die, wherein the second test structure of the second die is between the first test structure of the first die and the first scribeline of the first die area.

2. The semiconductor wafer as defined in claim 1, further comprising:
   a third die formed on the wafer next to the second die, wherein:
      the second die comprises a third test structure and the second die area includes a second scribeline; and
      the third die comprises a fourth test structure, the fourth test structure formed between the second scribeline of the second die area and the third test structure of the second die.

3. The semiconductor wafer as defined in claim 2, further comprising:
   a fourth die formed on the wafer next to the second die, wherein:
      the second die comprises a fifth test structure and the second die area includes a third scribeline; and
      the fourth die comprises a sixth test structure, the sixth test structure formed between the third scribeline of the second die area and the fifth test structure of the second die.

4. The semiconductor wafer as defined in claim 3, further comprising:
   a fifth die formed on the wafer next to the second die, wherein the second die comprises a seventh test structure and the fifth die comprises an eighth test structure, the eighth test structure formed between the second die area and the seventh test structure of the second die.

5. The semiconductor wafer as defined in claim 1, wherein the first die comprises two scribelines that are formed near edges of the first die area, and the second die comprises two scribelines that are formed near edges of the second die area.

6. The semiconductor wafer as defined in claim 1, wherein the second die area is formed between the first die area and the first test structure.

7. A semiconductor wafer comprising:
   a first die comprising a first test pattern and a first primary die, wherein the first test pattern is separate from the first primary die; and
   a second die, adjacent to the first die, comprising a second test pattern and a second primary die, wherein the second test pattern is separate from the second primary die, and wherein the second test pattern is located between the first primary die and the first test pattern.

8. The semiconductor wafer of claim 7, wherein the first primary die is adjacent to the second test pattern.

9. The semiconductor wafer of claim 7, wherein the first die and the second die are located in a row of dice on the semiconductor wafer.

10. The semiconductor wafer of claim 7, wherein the first test pattern is located between the second test pattern and the second primary die.

11. The semiconductor wafer of claim 7, wherein the second die further comprises a third test pattern and the semiconductor wafer further comprises a third die, adjacent to the second die, comprising a fourth test pattern and a third primary die, wherein the fourth test pattern is separate from the third primary die, and wherein the fourth test pattern is between the third test pattern and the second primary die.

12. The semiconductor wafer of claim 11, wherein the second primary die is adjacent to the first test pattern and the fourth test pattern.

13. The semiconductor wafer of claim 12, wherein the first die and the second die are located in a row of dice on the semiconductor wafer and the second die and the third die are located in a column of dice on the semiconductor wafer.

14. A semiconductor wafer comprising:
   a first die comprising a first test pattern, a first primary die, and a second test pattern, each separate from each other; and
   a second die, adjacent to the first die, comprising a third test pattern, a second primary die, and a fourth test pattern, each separate from each other, wherein the third test pattern is between the first primary die and the second test pattern.

15. The semiconductor wafer of claim 14, wherein the first primary die is adjacent to the third test pattern.

16. The semiconductor wafer of claim 14, wherein the first die and the second die are located in a row of dice on the semiconductor wafer.

17. The semiconductor wafer of claim 14, wherein the second test pattern is located between the third test pattern and the second primary die.

18. The semiconductor wafer of claim 14, further comprising a third die, adjacent to the second die, comprising a fifth test pattern, a third primary die, and a sixth test pattern, each separate from each other, wherein the fifth test pattern is between the second primary die and the fourth test pattern.

19. The semiconductor wafer of claim 18, wherein the first die and the second die are located in a row of dice on the semiconductor wafer and the second die and the third die are located in a column of dice on the semiconductor wafer.

* * * * *